United States Patent [19]

Blümel

[11] Patent Number: 4,893,252
[45] Date of Patent: Jan. 9, 1990

[54] MONITORING SYSTEM FOR THE OUTPUT STAGE OF A BRIDGE

[75] Inventor: Thomas Blümel, Schmitten, Fed. Rep. of Germany

[73] Assignee: VDO Adolf Schindling AG, Frankfurt am Main, Fed. Rep. of Germany

[21] Appl. No.: 123,116

[22] Filed: Nov. 20, 1987

[30] Foreign Application Priority Data

Dec. 22, 1986 [DE] Fed. Rep. of Germany ....... 3643869

[51] Int. Cl.$^4$ .......................... G01R 19/10; G05F 1/56
[52] U.S. Cl. .................. 364/483; 307/296.6; 323/274; 323/322; 361/79
[58] Field of Search ....................... 364/480, 481, 483; 361/79, 86; 323/274, 277, 280, 281, 283, 284, 322; 307/297

[56] References Cited

U.S. PATENT DOCUMENTS 4,106,095 8/1978 Yarbrough .......................... 364/483
4,438,498 3/1984 Sekel et al. .......................... 364/483
4,550,360 10/1985 Dougherty .......................... 364/483

FOREIGN PATENT DOCUMENTS 3432561 3/1986 Fed. Rep. of Germany .
56-10351 8/1981 Japan .
2107146 4/1983 United Kingdom .

OTHER PUBLICATIONS

Czirr, Eugen; "Kurzschlubsicherer 100-W-HiFi-Leistungsverstärker"; Radio-Fernsehen-Elektronik 26; 1977; pp. 590-593.

Primary Examiner—Bruce Y. Arnold
Assistant Examiner—Terry S. Callaghan
Attorney, Agent, or Firm—Martin A. Farber

[57] ABSTRACT

In a monitoring system for a bridge output stage which is connected in series with a controllable source of current, to the terminals of a source of operating voltage, the voltage over the bridge output stage and the voltage drop over a current-measurement resistor are fed to a subtraction circuit. The subtraction circuit is connected, via an analog-to-digital converter, to an input of a microcomputer, and a program is provided by which it is tested whether the voltage at the input of the microcomputer lies within a predetermined range. The operating voltage and the voltage over the controllable source of current are preferably fed to a further subtraction circuit the output of which is connected to an output of the subtraction circuit.

11 Claims, 1 Drawing Sheet

MONITORING SYSTEM FOR THE OUTPUT STAGE OF A BRIDGE

FIELD AND BACKGROUND OF THE INVENTION

The present invention relates to a monitoring system for a bridge output stage which is connected, in series with a controllable source of current, to the terminals of a source of operating voltage.

In bridge output stages of the aforementioned type, also known as current-regulated bridge output stages, a short-circuit of the load or of an output-stage transistor cannot be readily detected. An interruption in a branch of the bridge or in the feed line to the load as well as within the load itself can also not be detected without additional measures. In particular, if such output stages are used in systems which must have a high degree of reliability, recognition of said defects is absolutely essential.

SUMMARY OF THE INVENTION

It is an object of the invention to provide a monitoring system for current-regulated bridge output stages which makes short-circuits and discontinuities in the region of the output stage, the feed line to the load and the load itself detectable.

According to the invention, a monitoring system is provided in which the voltage over the bridge output stage (1-4) and the voltage drop on a current-measurement resistor (7) are fed to a subtraction circuit (37), that the subtraction circuit (37) is connected via an analog-digital converter (41) to an input of a microcomputer (25), and that a program is provided by which it is tested whether the voltage at the input of the microcomputer (25) lies within a predetermined range.

The system of the invention is suitable, in particular, for control systems in which a microcomputer controls setting members via current-controlled bridge output stages. Such systems are used, for instance, in automotive vehicles in order to regulate the amount of fuel. The monitoring system of the invention has the advantage that the monitoring is independent of the output current set at the time.

In current-regulated bridge output stages in which the source of current is connected to ground and the output stage is connected to the terminal of the source of operating voltage which is remote from ground, one advantageous further development of the invention consists therein that the operating voltage and the voltage over the controllable source of current (6 to 11) are fed to a further subtraction circuit (31) the output of which is connected to an input of the subtraction circuit (37).

In accordance with another further development of the invention, the voltages are fed via voltage dividers (29, 30; 33, 34; 36, 39) to the subtraction circuit (37) or circuits (31, 37). In this way, adaptation of the monitoring system to the corresponding values of the voltages within the region of the bridge output stage and the source of current is possible.

One advantageous development of the invention provides that each of the subtraction circuits (31, 37) is formed by a negative-feedback operational amplifier.

Another development of the invention is concerned with the bridge output stage. Thus it can, for instance, be provided that each of two bridge branches consists of two transistors (1, 2; 3, 4) the base-emitter paths of which are connected in series and the base terminals of which are connected in each case via a resistor (13, 14; 15, 16) to the collector of a driver transistor (17, 18), that both bridge branches are arranged between the one terminal (5) of the source of operating voltage and the output of the controllable current source (6 to 11), and that the junction points of the transistors (1, 2; 3, 4) corresponding in each case to one bridge branch form the output of the bridge output stage.

In accordance with another advantageous embodiment, each of the base terminals of the two driver transistors (17, 18) is connected to an output (21, 22) of the microcomputer (25). In this way, the direction of flow of the current through the load can be controlled by means of the microcomputer or the load can be disconnected entirely.

Another advantageous embodiment resides therein that the controllable source of current is formed by another transistor (6) the collector of which is the output of the controllable source of current and the emitter of which is connected via a current-measurement resistor (7) to the other terminal of the source of operating voltage, and that a difference amplifier (9) is provided the output of which is connected to the base of the further transistor (6), the inverting input of which can be fed the voltage on the current-measurement resistor (7) and the non-inverting input of which can be fed a control voltage.

In accordance with a further development, it is provided that both driver transistors (17, 18) are brought in succession by the microcomputer (25) into conductive state when the voltage at the input of the microcomputer (25) is outside the preestablished range. In this way it can be determined whether the discontinuity or short circuit is present in the region of the load or in one of the bridge branches.

Due to the fact that at least one additional program is stored in the microcomputer (25) and that the output of the bridge output stage is connected to a setting member, the microcomputer can advantageously be used both for the monitoring tasks and for the intended control.

In order to obtain a high input resistance of the operational amplifiers, the operational amplifiers (31, 37) can preferably be produced in C-MOS technique.

BRIEF DESCRIPTION OF THE DRAWINGS

With the above and other objects and advantages in view, the present invention will become more clearly understood in connection with the detailed description of a preferred embodiment when considered with the accompanying drawing, of which.

DETAILED DESCRIPTION OF THE PREFERRED EMBODIMENT

Figure 1:
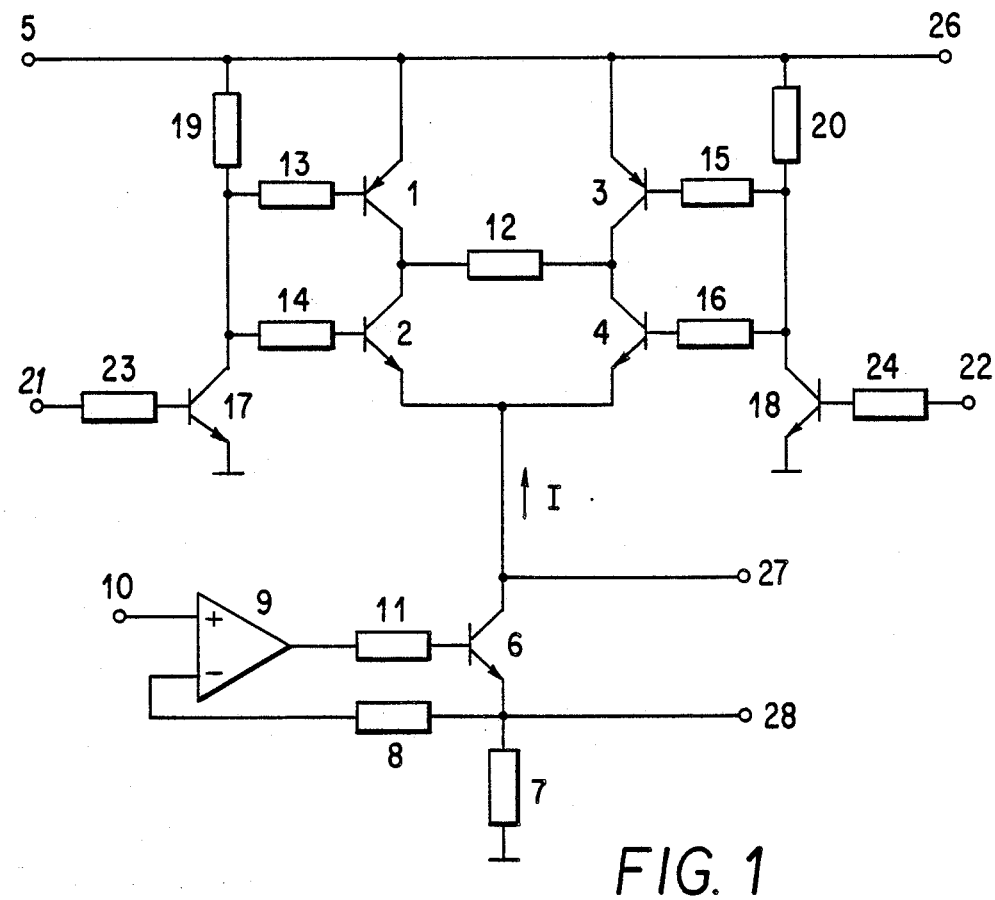
FIG. 1 is a known bridge output stage with a controllable source of voltage.

In the bridge output stage shown in FIG. 1, there are two bridge branches, each having two series-connected transistors 1, 2; 3, 4. The emitters of the pnp-transistors 1, 3 are connected to the positive terminal 5 of a source of operating voltage, not shown. In the case of an automotive vehicle this source of voltage is the vehicle battery. The emitters of the npn-transistors 2, 4 are connected to ground potential via a controllable source of current.

The controllable source of current consists of a transistor 6 within the emitter branch of which a current-measurement resistor 7 is inserted. The voltage drop over the current-measurement resistor 7 is a measure of the current flowing through the transistor 6. The emitter of the transistor 6 is furthermore connected via a resistor 8 to the inverting input of an operational amplifier 9 the non-inverting input of which is fed a control voltage for the current I via the terminal 10. The output of the operational amplifier 9 is connected to the base of the transistor 6 via another resistor 11.

The current I can now be conducted by suitable control of the transistors 1, 2; 3, 4 in both directions through the load which is represented as the resistor 12. For this purpose the base terminals of the output-stage transistors of each are bridge-branch connected respectively via a resistor 13, 14; 15, 16 to the collector of a driver transistor 17, 18. Each resistor 19, 20 serves as load resistance of the driver transistor. Via terminals 21, 22 and resistors 23, 24, the driver transistor 17, 18 can be brought into the conductive state.

The resistors 13, 14, 19, 23, on the one hand, and the resistors 15, 16, 20, 24, on the other hand, are so dimensioned that, with the driver transistor 17, 18 blocked, the upper transistor 1, 3 in each case of the corresponding bridge branch is blocked while the lower transistor 2, 4 is conductive. If a positive voltage is fed to a driver transistor 17, 18 via the terminal 21, 22, then the driver transistor 17, 18 becomes conductive, so that its collector assumes approximately ground potential. In this way, the lower transistor 2, 4 of the corresponding bridge branch receives a base voltage of about 0 V, so that it is blocked. The upper output stage transistor 1, 3 receives base current via the associated resistor 13, 15 so that it becomes conductive.

If a positive voltage is present at the terminal 21 while the terminal 22 is connected to ground potential, then the output-stage transistors 1 and 4 are conductive, while with a positive voltage at the terminal 22 and a voltage of 0 V at the terminal 21, the output-stage transistors 2, 3 are conductive and the output-stage transistors 1, 4 are blocked.

The terminals 21, 22 are connected to the identically referenced outputs of a microcomputer 25 (FIG. 2) whereby the current-controlled output stage which is shown in FIG. 1 can be controlled by the microcomputer 25. Furthermore, the input 10 for the control voltage can also be connected via a digital-to-analog converter to the microcomputer in order to control also the amount of the current from the microcomputer.

Figure 2:
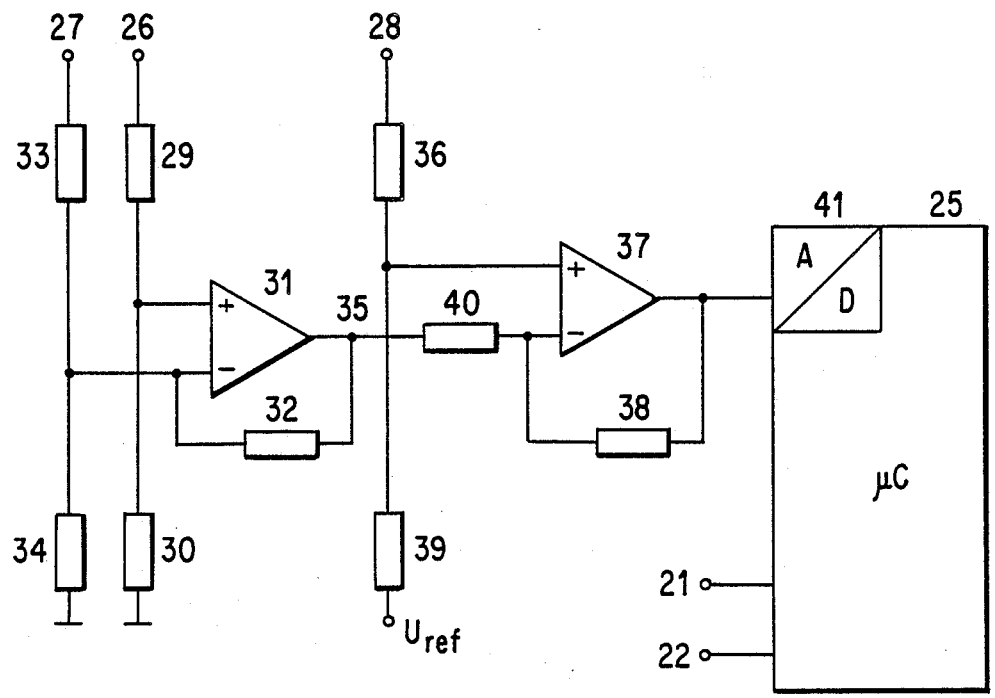
FIG. 2 is a circuit diagram of a system according to the invention.

The circuit arrangement shown in FIG. 2 is connected to the terminals 26, 27, 28 of the current-controlled output stage according to FIG. 1. In this way, the operating voltage fed at 5 comes to a voltage divider consisting of the resistors 29, 30. A portion of the operating voltage which corresponds to the divider ratio is fed to the non-inverting input of a first operational amplifier 31 which receives negative feedback by means of a resistor 32. The voltage over the source of current or over the series connection consisting of the transistor 6 and the resistor 7 (FIG. 1) is fed to a further voltage divider (33, 34) the output of which is connected to the inverting input of the operational amplifier 31.

Said first operational amplifier 31 forms, together with the negative-feedback resistor 32, a subtraction circuit at the output 35 of which there is present a voltage which corresponds to the difference, evaluated by the voltage divider 29, 30; 33, 34, between the operating voltage and the voltage over the source of current. This difference is, however, the voltage which is present in each case at the output stage or, neglecting the saturation voltage of the output-stage transistors, the voltage on the load 12 (FIG. 1).

As measure of the current adjusted in each case, the voltage on the current-measurement resistor 7 is fed, via the terminal 28 and the resistor 36, to the non-inverting input of a second operational amplifier 37 which operates also together with a negative feedback resistor 38 as subtraction circuit. A reference voltage Uref can also be fed via a resistor 39 to the non-inverting input of the operational amplifier 37. This reference voltage serves to compensate for the saturation voltages of the output-stage transistors and to establish a middle operating range of the second operational amplifier 37.

The output voltage of the first operational amplifier 31 is fed to the inverting input of the operational amplifier 37 via a resistor 40.

The output voltage of the operational amplifier 37 is fed to an input of an analog-to-digital converter 41 which, in known manner, is part of a so-called single-chip microcomputer 25.

As already explained, the output voltage of the operational amplifier 31 corresponds, except for a constant factor, to the voltage over the output stage. With a preestablished resistance of the load 12, the feed lines (not shown) as well as of the output stage, this voltage is proportional to the current I. This proportionality is reflected in the resistors 29, 30, 33, 34, 36, 39. As a result of this, the input voltage of the operational amplifier 37 (and therefore the difference between the voltages on the non-inverting input and on the inverting input) is 0 V as long as the voltage over the input stage and the current I behave proportionally.

If a break occurs in the region of the output stage or in the region of the load, then the current drops towards zero, whereby the balance at the input of the operational amplifier is eliminated. In the event of a short circuit, the voltage drops towards zero while the current retains the value set. In this case also, the balance at the inputs of the operational amplifier 37 is eliminated.

In order that a voltage of the same polarity is always present at the input of the analog-to-digital converter 41, Uref is so selected that the middle of the working region of the operational amplifier 37 lies in the center of the input voltage range of the analog-to-digital converter 41 and therefore, for instance, at 2.5 V.

By means of the program stored in the microcomputer 25, regular inquiry is made as to whether the input voltage of the analog-to-digital converter 41 lies within a predetermined range of, for instance, 2.4 V to 2.6 V. If a voltage within this range is present it can then be concluded that there is a discontinuity, while a voltage above this region indicates a short circuit.

In accordance therewith, the direction of the current is briefly changed by the load 12 (FIG. 1), for which purpose the microcomputer 25 for a short time interchanges the signals at the outputs 21, 22. If the same error is reported with both directions of the current then there is involved a defect in the load 12 or in the feed line. However, if the defect is present only in one direction of the current then it can be concluded that there is such a defect in the output stage. The voltages fed to the operational amplifiers should correspond as precisely as possible to the portion of the voltages fed at the time to the terminals 26, 27, 28. In order to make this possible with high-ohm voltage dividers which, in their turn, do not excessively load the output stage and the controllable source of current, operational amplifiers of C-MOS type preferably are used.

I claim:

1. A monitoring system for an electric power source capable of supplying current to a load, wherein the power source is to be energized by a source of operating voltage, the power source having a controllable source of current and a bridge output stage, which stage is connected in series with the controllable source of current between terminals of the source of operating voltage, the system comprising:
a subtraction circuit;
a computer with an analog-to-digital converter;
a current-measuring resistor connected in series with the bridge output stage; and wherein
a voltage drop across the bridge output stage and a voltage drop across the current-measuring resistor are applied to separate input terminals of the subtraction circuit, the subtraction circuit is connected via the analog-to-digital converter to an input of the computer, the computer being operated with a program for testing whether a voltage at the input of the computer lies within a predetermined range.

2. A monitoring system for an electric power source capable of supplying current to a load, wherein the power source is to be energized by a source of operating voltage, the power source having a controllable source of current and a bridge output stage, which stage is connected in series with the controllable source of current between terminals of the source of operating voltage, the system comprising:
a subtraction circuit;
a computer with an analog-to-digital converter;
a current-measuring resistor connected in series with the bridge output stage; and wherein
a voltage drop across the bridge output stage and a voltage drop across the current-measuring resistor are applied to separate input terminals of the subtraction circuit, the subtraction circuit is connected via the analog-to-digital converter to an input of the computer, the computer being operated with a program for testing whether a voltage at the input of the computer lies within a predetermined range;
the system further comprises a second subtraction circuit; and wherein
the operating voltage and the voltage across the controllable source of current are applied to the second subtraction circuit, an output of the second subtraction circuit being connected to an input of the first-mentioned subtraction circuit.

3. The system according to claim 2, wherein
at least one additional program is stored in the computer and an output of the bridge output stage is connectable to a fuel-delivery setting member for control of fuel in a motor vehicle by direction of said additional program.

4. The system according to claim 2, further comprising
voltage-divider means for applying to the first-mentioned subtraction circuit the voltage drop across the current-measuring resistor, and to the second subtraction circuit the operating voltage and the voltage drop across the bridge output stage.

5. The system according to claim 2, wherein
each of the subtraction circuits comprises a negative-feedback operational amplifier.

6. A monitoring system for an electric power source capable of supplying current to a load, wherein the power source is to be energized by a source of operating voltage, the power source having a controllable source of current and a bridge output stage, which stage is connected in series with the controllable source of current between terminals of the source of operating voltage, the system comprising:
a subtraction circuit;
a computer with an analog-to-digital converter;
a current-measuring resistor connected in series with the bridge output stage; and wherein
a voltage drop across the bridge output stage and a voltage drop across the current-measuring resistor are applied to separate input terminals of the subtraction circuit, the subtraction circuit is connected via the analog-to-digital converter to an input of the computer, the computer being operated with a program for testing whether a voltage at the input of the computer lies within a predetermined range;
said bridge output stage comprises two bridge branches each of which comprises two transistors;
in each of the two bridge branches the two transistors each have a base-emitter path and a base terminal, the base-emitter paths of the two transistors being connected in series via a junction point, an input section of each of said two bridge branches comprising a driver transistor and a pair of resistors;
in each of said two bridge branches, the base terminals of the two transistors are connected via respective resistors of the pair of resistors to the collector of the driver transistor;
both of said bridge branches are arranged between a terminal of the source of operating voltage and an output of the controllable current source; and
junction points of the two bridge branches serve as output terminals of the bridge output stage.

7. The system according to claim 6, wherein
a base terminal of each of the two driver transistors is connected to an output terminal of the computer.

8. The system according to claim 6, wherein
the controllable source of current comprises a further transistor having a collector terminal which serves as output of the controllable source of current and having an emitter terminal which is connected via said current-measuring resistor to a further terminal of the source of operating voltage; the system further comprising
a difference amplifier having inverting and non-inverting inputs, an output of the difference amplifier being connected to a base terminal of the current-source transistor, the inverting input receiving the voltage drop across the current-measuring resistor, and the non-inverting input receiving a control voltage.

9. The system according to claim 6, wherein
said driver transistors are activated in succession by the computer to be in a conductive state when the voltage at the input of the computer is outside a predetermined range.

10. The system according to claim 9, wherein
each of said subtraction circuits comprises an operational amplifier formed of C-MOS construction.

11. A monitoring system for an electric power source capable of supplying current to a load, wherein the power source is to be energized by a source of operating voltage, the power source having a controllable source of current and a bridge output stage, which stage is connected in series with the controllable source of current between terminals of the source of operating voltage, the system comprising:
- a subtraction circuit;
- a computer with an analog-to-digital converter;
- a current-measuring resistor connected in series with the bridge output stage; and wherein
- a voltage drop across the bridge output stage and a voltage drop across the current-measuring resistor are applied to separate input terminals of the subtraction circuit, the subtraction circuit is connected via the analog-to-digital converter to an input of the computer, the computer being operated with a program for testing whether a voltage at the input of the computer lies within a predetermined range; and the system further comprises voltage-divider means for applying to the subtraction circuit the voltage drop across the current-measuring resistor.

* * * * *